United States Patent [19]

Potthast et al.

[11] Patent Number: 5,606,259
[45] Date of Patent: Feb. 25, 1997

[54] ADAPTABLE ANTENNA FOR A MAGNETIC RESONANCE APPARATUS INCLUDING A WIPER CONTACT FOR VARYING THE SIZE OF THE ANTENNA WITHOUT FREQUENCY CHANGE

[75] Inventors: Andreas Potthast, Forchheim; Wilhelm Duerr, Erlangen, both of Germany

[73] Assignee: Siemens Aktiengesellschaft, Munich, Germany

[21] Appl. No.: 419,548

[22] Filed: Apr. 10, 1995

[30] Foreign Application Priority Data

Apr. 15, 1994 [DE] Germany .......................... 44 13 209.3
Feb. 15, 1995 [DE] Germany .......................... 195 05 063.0

[51] Int. Cl.$^6$ ........................ G01R 33/44; G01R 33/465
[52] U.S. Cl. ........................ 324/378; 128/653.5
[58] Field of Search ........................ 324/300, 307, 324/318, 321, 322; 128/653.2, 653.5

[56] References Cited

U.S. PATENT DOCUMENTS

| 4,587,493 | 5/1986 | Sepponen . | |
|---|---|---|---|
| 4,793,356 | 12/1988 | Misic et al. | 324/318 |
| 4,887,038 | 12/1989 | Votruba et al. | 324/318 |
| 4,897,604 | 1/1990 | Carlson et al. . | |
| 5,097,210 | 3/1992 | Requardt et al. . | |
| 5,130,656 | 7/1992 | Requardt et al. | 324/318 |
| 5,168,233 | 12/1992 | Zibolski | 324/322 |
| 5,210,494 | 5/1993 | Brumeret et al. | 324/309 |
| 5,327,898 | 7/1994 | Yoshino et al. . | |
| 5,435,302 | 7/1995 | Lenkinski et al. | 128/653.5 |

FOREIGN PATENT DOCUMENTS 0233211  6/1991  European Pat. Off. .

Primary Examiner—Sandra L. O'Shea
Assistant Examiner—Roger C. Phillips
Attorney, Agent, or Firm—Hill, Steadman & Simpson

[57] ABSTRACT

An antenna for a magnetic resonance apparatus has an antenna conductor that can be adapted to examination regions of different sizes, with one region of the antenna conductor divided into conductor sections. The conductor sections are connected to one another via capacitive elements, with the conductor sections and the capacitive elements connected alternating in series. The conductor sections are connectable to the remaining antenna conductor via releasable electrical connections.

22 Claims, 6 Drawing Sheets

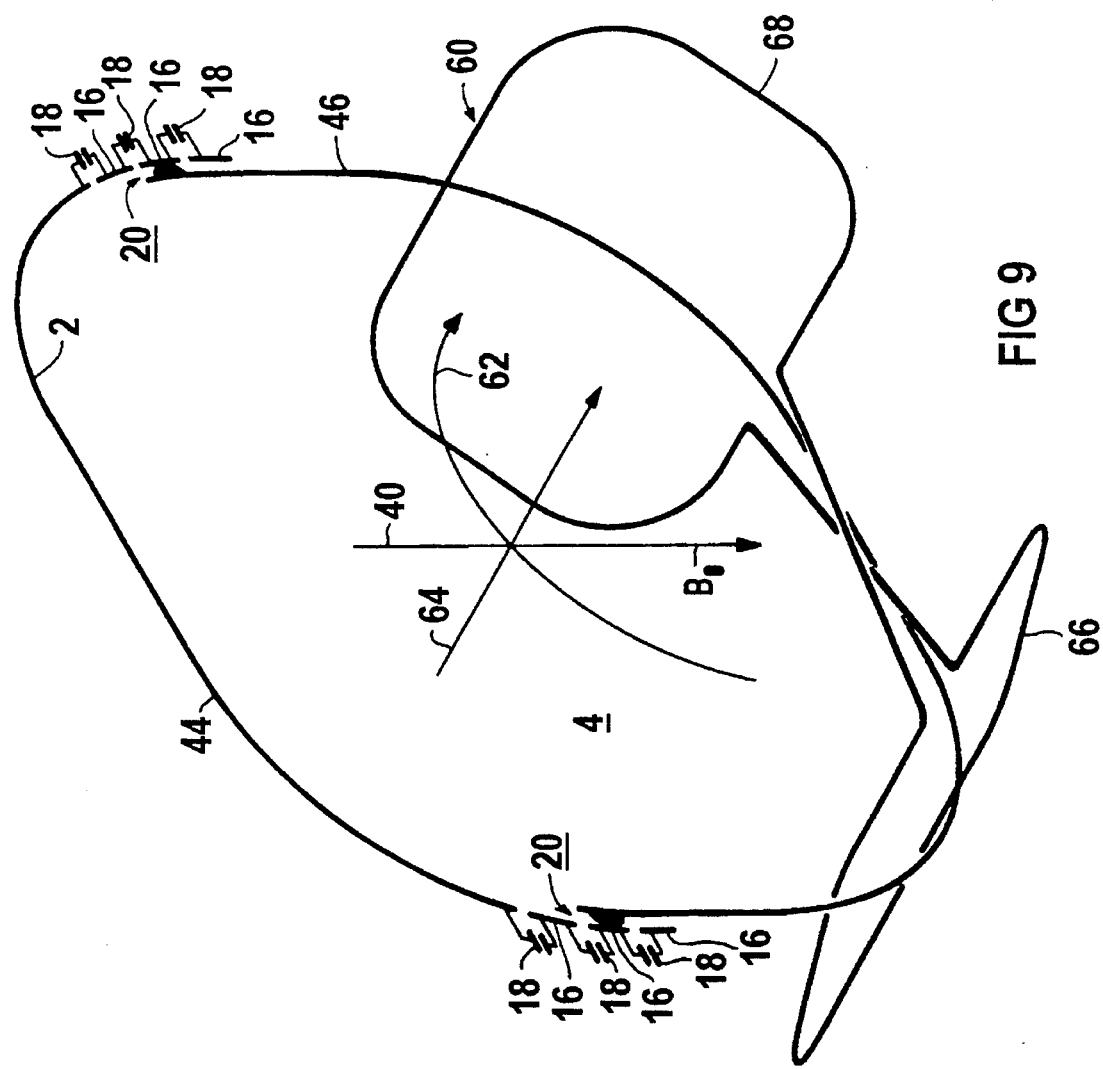

5,606,259

ADAPTABLE ANTENNA FOR A MAGNETIC RESONANCE APPARATUS INCLUDING A WIPER CONTACT FOR VARYING THE SIZE OF THE ANTENNA WITHOUT FREQUENCY CHANGE

BACKGROUND OF THE INVENTION

1. Field of the Invention

The present invention is directed to an antenna for a magnetic resonance apparatus having an antenna conductor that can be adapted to examination regions of different sizes.

2. Description of the Prior Art

Local antennas are utilized in a diagnostic magnetic resonance apparatus for the examination of sub-regions (i.e., a body portion) because they have a better signal-to-noise ratio compared to a whole body antenna. It is thereby meaningful to adapt the local antenna to the body part or to the examination region to be examined as exactly as possible in order to achieve a high filling factor, and thus to optimize the signal-to-noise ratio of the antenna.

U.S. Pat. No. 4,897,604 discloses an antenna of the type generally described. This known antenna is fashioned as a frame antenna that embraces an examination volume. The conductor of this frame antenna has a gap into which conductor bridges of different lengths can be inserted. The conductor bridges can comprise a capacitor whose capacitance compensates the inductance of the conductor bridges at an operating frequency of the magnetic resonance apparatus. The resonant behavior of the antenna is therefore minimally influenced by the inserted conductor bridges. The tuning and matching circuit required for the tuning of the antenna can consequently cover the same tuning range as antennas that are not adaptable or variable in size. Manipulation of this known antenna in the adaptation to examination regions of different sizes, however, is complicated. A number of conductor bridges of different lengths must be kept on hand, a conductor bridge having a suitable length having being selected therefrom.

German OS 42 21 759 discloses an antenna for circularly polarized high-frequency magnetic fields, composed of a combination of two sub-antennas whose antenna characteristic or magnetic axes reside perpendicularly relative to one another. The first sub-antenna is thereby fashioned as a frame coil and the second sub-antenna is fashioned as two saddle coils arranged lying opposite one another. The antenna is partly flexible and can therefore be brought into intimate contact with a patient. The antenna can be adapted to examination regions of different sizes by interchanging coil parts.

The antenna conductor of a local antenna disclosed in European Application 0 233 211 can also be adapted to examination regions of different sizes. The antenna conductor therein is glued on a thin, flexible carrier of electrically insulating material. The material is adequately flexible in order to wrap the antenna tightly around an examination region. The carrier material has fastening means in order to detachably secure the antenna to the examination region. A disadvantage of this known antenna is that the inductance, and thus the operating frequency of the antenna, change given a variation of the diameter of the antenna. In order to be able to operate the antenna at an unchanging operating frequency, a large swing (adjustment range) for the capacitors must be provided in the tuning or matching circuit. This requires a high circuit outlay.

European Application 0 396 804 discloses a local antenna having a conductor arrangement that can be interconnected to different active coil segments in the form of reception loops having different sizes and/or different positions. Each end of each possible reception Iccp is thereby connected to a signal reference line via a first controllable capacitor and to a signal line connected to an evaluation unit via a second controllable capacitor. This arrangement makes it possible to activate individual coil segments, to tune them to resonance, and match them to an impedance of the feeder or of the evaluation unit.

German OS 33 23 657 discloses an antenna wherein the geometry of the antenna conductor loops is variable.

SUMMARY OF THE INVENTION

An object of the present invention is to provide a local antenna suitable for use in a nuclear magnetic resonance apparatus that can be adapted to examination regions of different sizes in a simple way without a significant shift of its operating frequency.

This object is achieved in a local antenna constructed in accordance with the principles of the present invention having a region of the antenna conductor divided into conductor sections; the conductor sections being connected to one another via capacitive elements, and the conductor sections and capacitive elements being connected alternately in series. The conductor sections can be connected to the rest of the antenna conductor via a releasable electrical connection.

With a change in the length of the overall antenna conductor, capacitive elements are simultaneously inserted or removed dependent on the change in the inductance of the antenna conductor connected thereto. The operating frequency or resonant frequency of the local antenna is thus preserved. The scale of the antenna can thus be varied without the resonant frequency being significantly influenced. For example, a local antenna having a circularly antenna conductor with a radius of 10 cm thus has an inductance of approximately 300 mH. In order to operate the antenna at an operating frequency of, for example, 63 mHz, the antenna conductor would have to be closed by a capacitor having a capacitance of approximately 20 pF. In accordance with the invention, this capacitor is divided into a plurality of capacitive elements that are inserted into the antenna conductor in a region, whereby the series circuit of the individual capacitive elements must yield the value of 20 pF. Given an essentially equidistant distribution, the capacitance of an individual capacitive element is a multiple of the plurality of inserted capacitive elements. Since the inductance of the ideal, circular antenna conductor is approximately proportional to the radius, the resonant frequency is thus independent of the diameter or size of the local antenna. In a practical application of such a local antenna, an ideal circle is usually not formed, but a more or less oval form is used. The advantage is nonetheless preserved that the local antenna can be adapted to examination regions of different sizes without a significant modification of the operating frequency.

In an advantageous embodiment the conductor sections are arranged in series on a dielectric carrier as first interconnects insulated from one another. Known methods from printed circuit board fabrication can thus be employed for manufacturing the local antenna.

In another embodiment, second interconnects insulated from one another are arranged in series on the dielectric carrier on a side thereof opposite the first interconnects, the second interconnects respectively overlapping two of the first interconnects. The two-sided, overlapping arrangement of the interconnects on the electrical carrier simultaneously forms the capacitive elements in the overlap region.

In another embodiment, the interconnects have at least one slot aligned in the direction of the series arrangement. Eddy current losses in the interconnects can thus be reduced.

In another embodiment, the releasable electrical connection is fashioned as wiper contact. The local antenna can thus be adapted especially simply to examination regions of different sizes.

In another embodiment, the rest of the antenna conductor is connected to a wiper pick-up of the wiper contact and a surface of the first or second conductor sections is fashioned as a sliding track for the wiper contact.

In a further embodiment, both ends of the rest of the antenna conductor are connectable to the conductor sections via respective, releasable electrical connections. Less flexible local antennas can thus also be simply adapted to examination regions of different sizes.

In another embodiment, the wiper pick-up is fashioned larger in the direction of the series arrangement of the conductor sections than the spacing of neighboring conductor sections. It is thus assured that at least one conductor section will be reliably electrically connected to the wiper contact.

In order to be able to match the antenna conductor as tightly as possible to the examination region, the antenna conductor is fashioned at least partially flexibly.

In a further version, the wiper contact is connected to catch elements, said catch means defining positions or positional ranges of parts of the wiper contact. A simple adaptation to the size of the examination region is established by the wiper contacts, whereby the catch elements preclude unreliable electrical connections in the region of the transitions from one conductor section to another.

Good guidance of the wiper contact is achieved in an embodiment wherein the antenna conductor, including the region of the conductor sections and capacitive elements, is surrounded by a housing, the housing being fashioned as a sheath in the region of the conductor sections and capacitive elements. The conductor sections have sliding tracks for the wiper contact and are arranged at an inside of the sheath. A wiper pick-up for the wiper contact can be introduced into the sheath at an end of the rest of the antenna conductor.

In another embodiment, the antenna conductor has a first antenna sub-conductor and a second antenna sub-conductor that can be separated from the first antenna sub-conductor. Each end of the first antenna sub-conductor has a region at which the conductor sections and the capacitive elements are disposed. The conductor sections of the two end regions are electrically connected to corresponding ends of the second antenna sub-conductor via respective wiper contacts allocated to the regions. The antenna is especially easily accessible as a result of the subdivision into two antenna sub-conductors.

In a further embodiment, each catch element has a catch nose resiliently arranged at the sheath, said catch nose being provided for engagement in recesses that are arranged in series following one another in the housing at the end of the rest of the antenna conductor.

An especially simple fashioning of the catch elements is achieved in an embodiment wherein the catch elements are fashioned as protuberances that lie between the conductor sections in a path of a wiper pick-up for the wiper contact.

In another embodiment, a second conductor arrangement forms a circularly polarizing antenna arrangement together with the antenna conductor. The second conductor arrangement has two conductor loops that adjoin the examination space lying opposite one another in the region of the antenna conductor and that are electrically connected to one another in the same direction. The antenna conductor thereby generates or receives a first field component and the two conductor loops generate or receive a second field component residing perpendicularly to the first field component. The inductance of the two conductor loops varies little in the adaptation to examination regions of different sizes, on the order of magnitude of less than 10%. No compensation with capacitors is therefore required given the two conductor loops. The decoupling of the two systems can ensue either electrically or geometrically, as in known arrangements.

In a further embodiment, the conductor loops are arranged in two substantially planar surfaces that are oriented obliquely relative to one another. The two conductor loops can thus be particularly utilized for the examination of edge regions such as, for example, the spinal column.

A circularly polarizing antenna that can be handled in a simple way has the aforementioned two conductor loops arranged only in the region of an antenna sub-conductor.

DESCRIPTION OF THE DRAWINGS

FIG. 9 is a perspective view of a circularly polarizing antenna constructed in accordance with the principles of the present invention.

DESCRIPTION OF THE PREFERRED EMBODIMENTS

Figure 1:
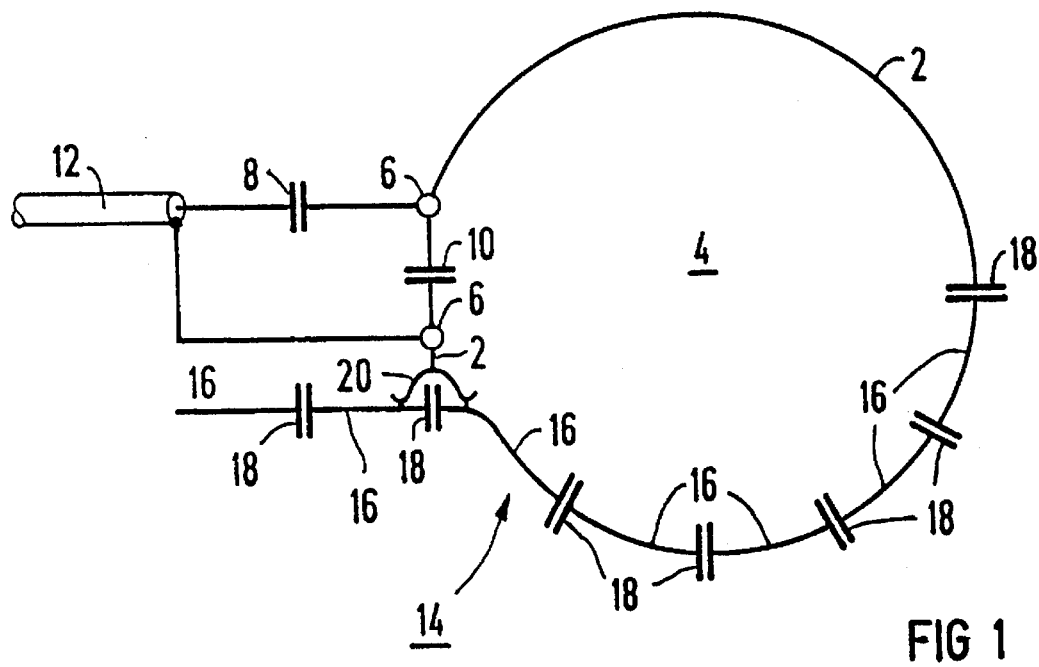
FIG. 1 is a schematic illustration of an antenna having conductor sections implemented as interconnects that are connected to one another via capacitors constructed in accordance with the principles of the present invention.

In a plan view, FIG. 1 shows a local antenna having an antenna conductor 2 that is arranged around an examination region 4. The examination region 4 can also extend above and below the antenna conductor 2. The antenna conductor 2 is connected via an electrical terminal 6 to a matching network that includes two capacitors 8 and 10. The inner conductor of a coaxial line 12 is connected to the capacitor 8 and the outer conductor thereof is connected to one of the terminals 6. The local antenna can be employed both for transmitting and receiving, or as only for receiving, in a nuclear magnetic resonance apparatus.

A region 14 of the antenna conductor 2 is divided into conductor sections 16 of equal length. The conductor sections 16 are connected to one another via capacitive elements 18, with the conductor sections 16 and the capacitive elements 18 connected so as to alternate in series. The conductor sections 16 are each connected to the rest of the antenna conductor 2 via releasable electrical connection 3 fashioned in this embodiment as wiper contacts for which a wiper 20 is shown. This creates an electrical connection from the inside of the conductor sections 16 via only a short part of the rest of the antenna conductor 2 to an electrical terminal 6.

Figure 2:
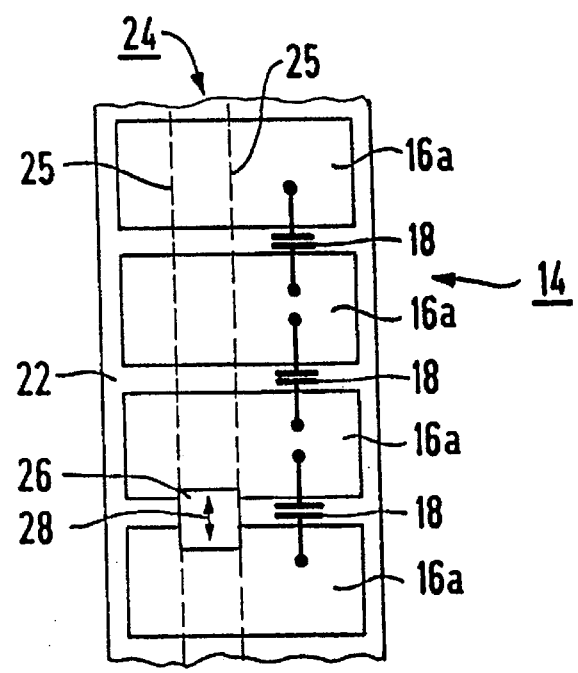
FIG. 2 shows a detail of a portion of the antenna of FIG. 1 with electrical connections fashioned as wiper contacts.

FIG. 2 shows a portion from the region 14 of the antenna conductor 2 in detail. The conductor sections 16, the form of interconnects 16a, are arranged in series electrically insulated from one another at one side on a dielectric, flexible carrier 22 such as, for example, Teflon ®foil. Neighboring interconnects 16a, are connected to one another via a capacitive element 18, for example in the form of a surface-mountable capacitor. The capacitive elements 18 are laterally arranged here so that space is created on the surface of the interconnects 16a for a sliding track 24 for the wiper 20. The track 24 is shown limited by the dot-dashed lines 25 in FIG. 2. A wiper pick-up 26 for the wiper 20 is displaceable in the direction of the series arrangement of the interconnect 16a, this being symbolized by a double arrow 28. Guide means (not shown) are provided that assure that the wiper pick-up 26 has good electrical contact with the interconnects 16a. The wiper pick-up 26 has a length in the wiping direction so that it can bridge the insulating spacing between the conductor sections formed by the interconnects 16a. It is thus assured that at least one interconnect 16a is always touched by the wiper pick-up 26.

Figure 3:
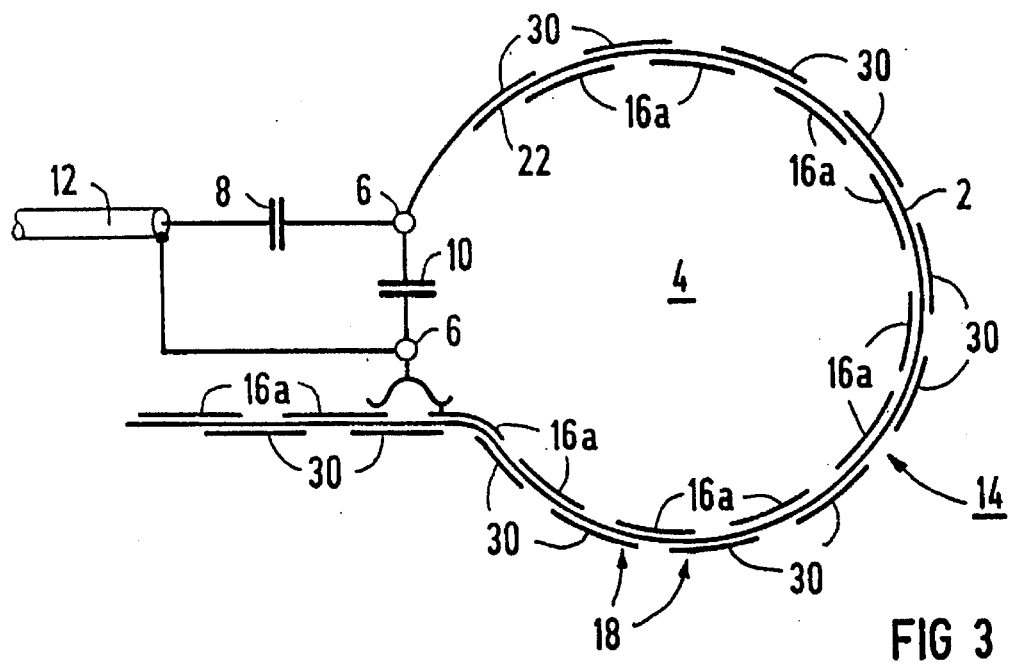
FIG. 3 is a schematic illustration of an antenna of the invention in an embodiment wherein the capacitors are formed by conductor sections that are electrically insulated from one another but overlap one another.

The local antenna of FIG. 3 differs from the local antenna of FIG. 2 in that second interconnects 30 are arranged insulated from one another on the dielectric carrier 22 at a side thereof opposite the first interconnects 16a, each second interconnect 30 overlapping two of the first interconnects 16a. Each overlapping region of two first interconnects 16a with a second interconnect 30 separated by the dielectric 22 forms a capacitive element 18.

Figure 4:
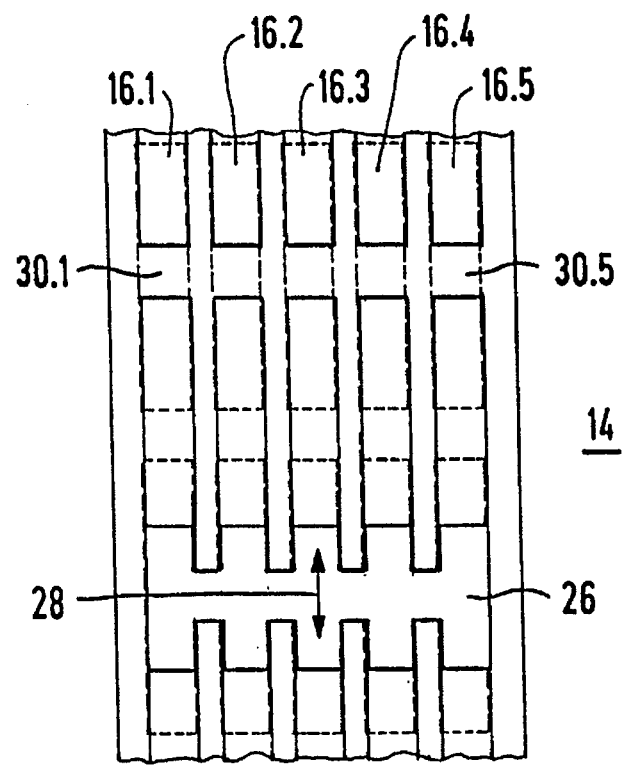
FIG. 4 shows a detail portion of the local antenna of FIG. 3 having electrical connection means fashioned as wiper contacts.

In detail, FIG. 4 shows a portion of the region 14 of the embodiment shown in FIG. 3. The first interconnects and the second interconnects 30 opposite thereto are both completely slotted in the longitudinal direction-by contrast to the interconnects 16a of FIG. 2—in order to reduce eddy currents. A total of four parallel slots are provided, dividing the first interconnects into five sub-interconnects 16.1–16.5. The second interconnects 30 are likewise slotted and divided into five sub-interconnects 30.1–30.5 that are shown with broken lines in FIG. 4 because they lie on the backside. The wiper pick-up 26 is composed of five individual wiper pick-ups that are connected in parallel. The sliding tracks are formed by the entire surface of the individual sub-interconnects 16.1–16.5. Again, the displaceability is symbolized by a double arrow 28.

Figure 5:
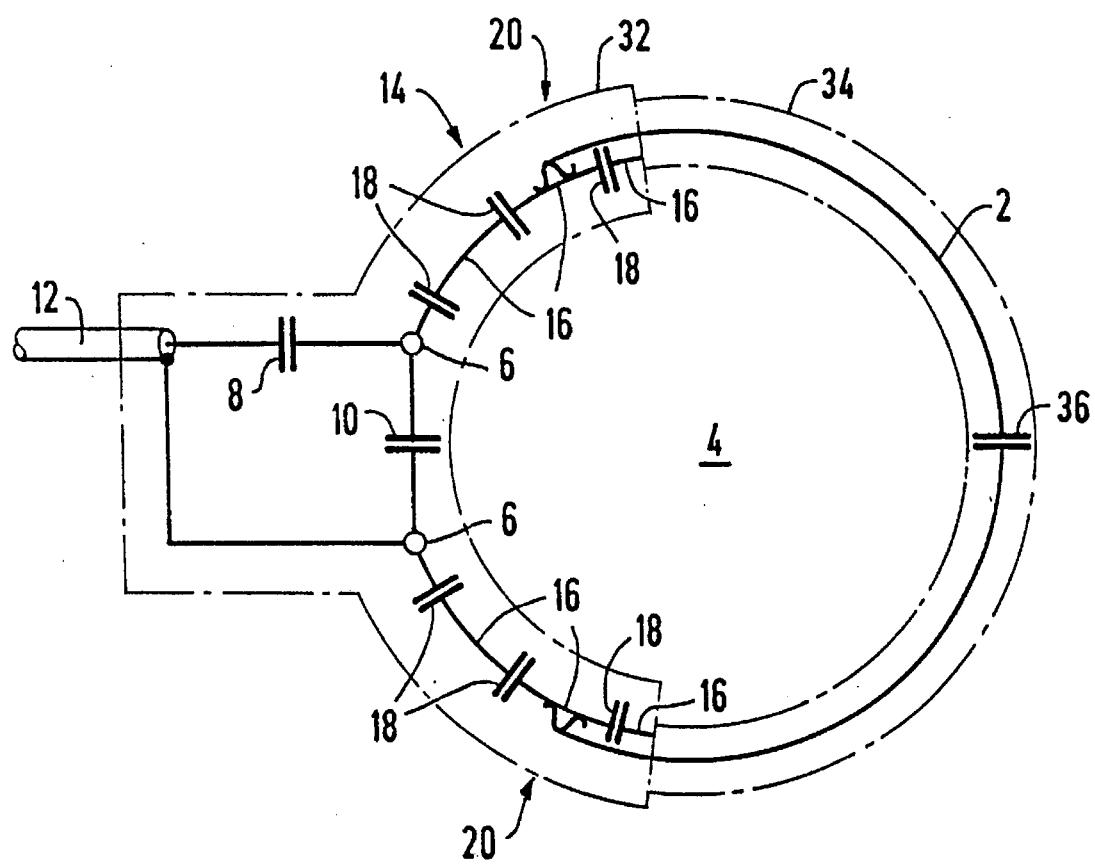
FIG. 5 is a schematic illustration of a local antenna having symmetrically arranged wiper contacts.

FIG. 5 shows a local antenna having two symmetrically arranged wipers 20. A housing surrounding the electrical part of the local antenna is also shown in FIG. 5, this housing being composed of two nested sub-housings 32 and 34. The sub-housing 34 is introducible into the sub-housing 32, the overall housing simultaneously serving to guide the wipers 20. The region 14 having the conductor sections and capacitive elements 18 connected following one another can be implemented in the embodiment to FIG. 5 as set forth in FIG. 2 or in FIG. 4. A capacitor 36 arranged opposite the electrical terminals 6 in the middle of the remaining conductor 2 is provided in order to simplify the structure of the conductor 2 in the housing 34. Its value, together with the capacitive elements 18, is defined by the operating or resonant frequency.

Figure 6:
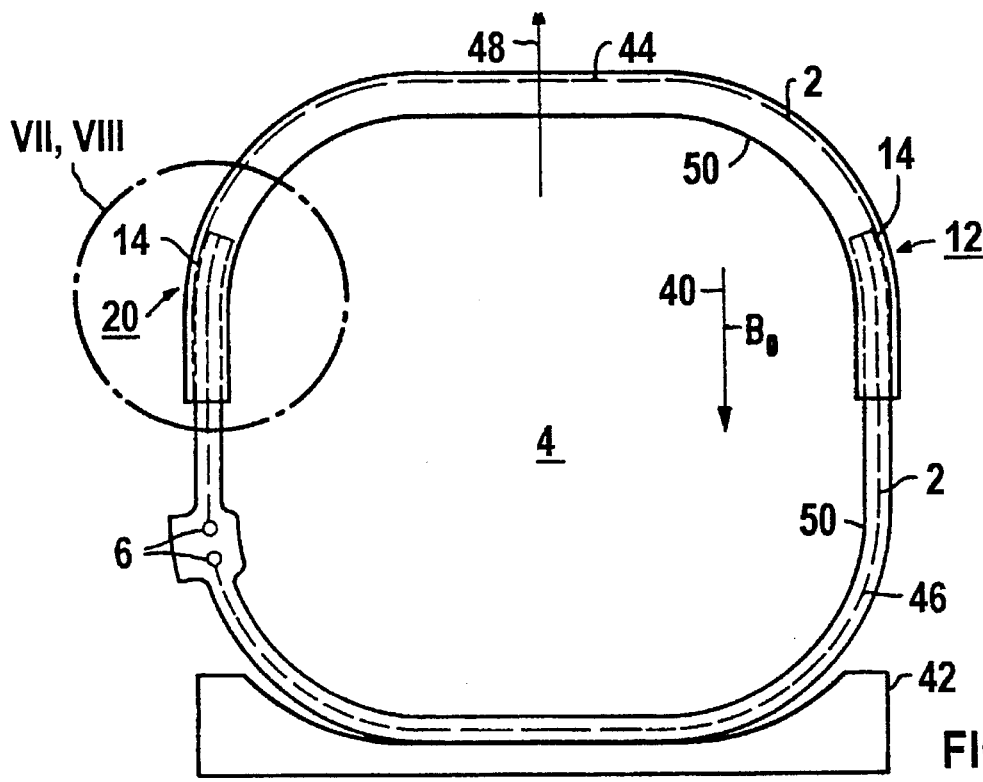
FIG. 6 is a view from above of a further embodiment antenna of the invention which is variable in size and has symmetrically arranged wiper contacts.

In from above, FIG. 6 shows an antenna as utilized in a magnetic resonance apparatus having a vertical basic field $B_o$ (illustrated by an arrow 40). The antenna is aligned perpendicularly to the surface of a patient bed 42 and is dimensioned in terms of size so that magnetic resonance examinations of an upper body of a patient can be implemented. The antenna conductor 2 is divided into a first antenna sub-conductor 44 and a second antenna sub-conductor 46. The second antenna sub-conductor 46 lies on the patient bed 42. The two antenna sub-conductors 44 and 46 can be completely separated from one another (illustrated by an arrow 48), so that the examination volume 4 for the patient is easily accessible. The first antenna sub-conductor 44 has a region 14 at each end at which the conductor sections 16 and the capacitive elements 18 are disposed. The electrical connection of the two antenna sub-conductors 44 and 46 at the two separating locations ensues via respective wipers 20. The antenna conductor 2, including the regions 14, is surrounded by an electrically insulating housing 50 that is at least partially flexible.

Figure 7:
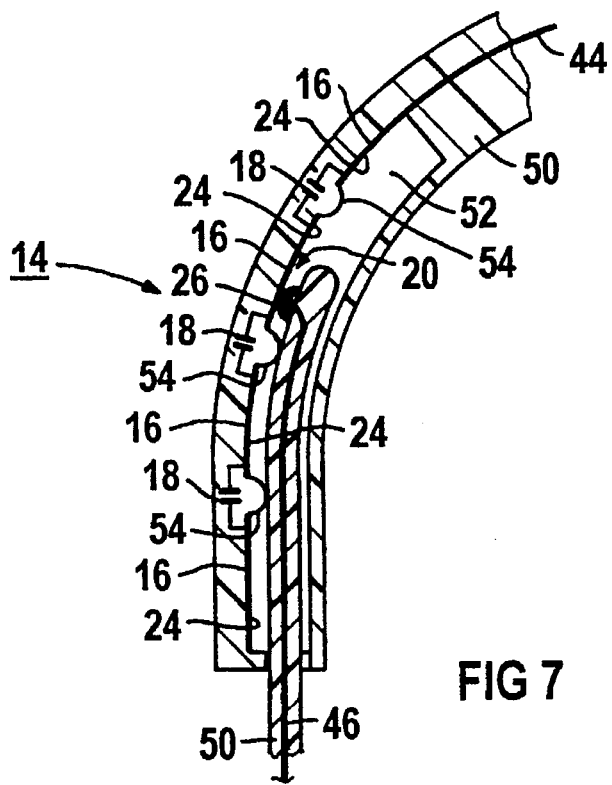
FIG. 7 is a detail from FIG. 6 showing a first embodiment of the catch elements.
Figure 8:
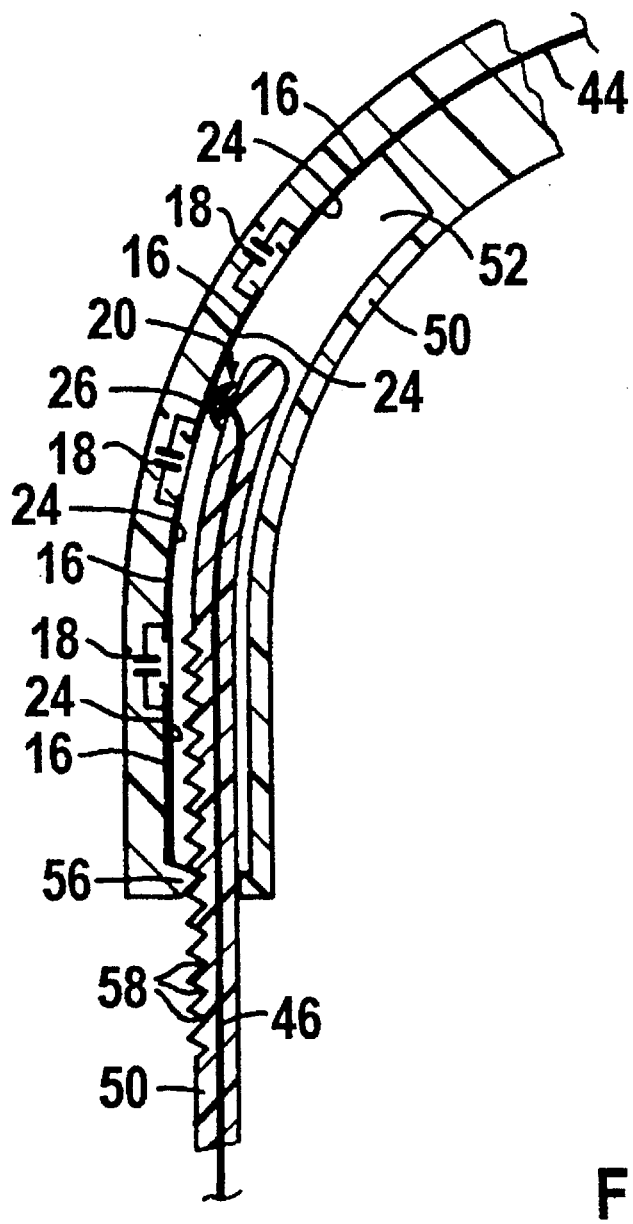
FIG. 8 is a detail from FIG. 6 showing a second embodiment of the catch elements.

FIGS. 7 and 8 show details of the left separating location of the antenna enclosed by a dot-dash circle in FIG. 6. The right separating location is implemented mirror symmetrically relative to the left parting location. The housing 50 of the sub-conductor 44 is fashioned as a sheath 52 at both ends in the region 14 of the conductor sections 16 and the capacitive elements 18, whereby the tracks 24 for the wiper 20 are arranged at an inside of the sheath 52. The tracks 24 are essentially formed by the surface of the conductor sections 16. The wiper pick-up 26 in contact with the tracks 24 is arranged at the end of the remaining antenna conductor 44 and can be introduced into the sheath 52.

For defining positioning regions for the wiper pick-up 26, catch elements are connected to or formed as an integral part of the wiper 20, these catch elements being formed by protuberances 54 arranged between the conductor sections 16 in the embodiment shown in FIG. 7. The protuberances 54 lie in the wiper path of the wiper pick-up 26 and, due to the spring pressing power of the wiper pick-up 26, cause the wiper 20 always to be electrically connected to only one conductor section 16.

FIG. 8 shows another embodiment of the catch elements. A catch projection 56 arranged at the sheath 52 resiliently engages recesses 58 arranged following one another in the housing 50 of the first antenna sub-conductor 44. Independently of the length of the conductor section 16, the size of the antenna can thus be set with a fine grid spacing.

For better electrical contacting, the wiper 20 has a number of wiper pick-ups 26 that are arranged next to one another perpendicularly to the direction of the tracks and are connected electrically in parallel. The parallel arrangement of the wiper pick-ups 26 cannot be seen in FIGS. 7 and 8 since the front wiper pick-up 26 covers the wiper pick-ups 26 lying therebehind.

The contact surfaces of the wiper contact 20 that touch one another are coated with a precious metal such as, for example, gold, so that the extremely small antenna signals are not significantly attenuated or otherwise degraded upon transmission via the wiper 20 and so that a long service life of the wiper contact 20 is assured.

The circularly polarizing antenna shown in FIG. 9 is derived from the above-described embodiments in that a second conductor arrangement 60 is allocated to the antenna conductor 2, the magnetic axis 62 of the second conductor arrangement 60 being aligned perpendicularly to the magnetic axis 64 of the antenna conductor 2. The two magnetic axes 62 and 64 reside perpendicularly to the direction of the main magnetic field $B_o$. The second conductor arrangement 60 has two conductor loops 66 and 68 disposed opposite another and adjoining the examination volume 4 in the region of the second antenna sub-conductor 46. The loops 66 and 68 are electrically connected to one another in series or in parallel in the same direction. A series circuit is realized in FIG. 9, so that a current path in the shape of a figure-eight arises.

The two conductor loops 66 and 68 are disposed in respective planes. The planes are oriented obliquely relative to one another and parallel to the magnetic axis 64. As a result, the second conductor arrangement 60 is geometrically decoupled from the antenna conductor 2.

As a result of the oblique orientation of the two conductor loops 66 and 68 relative to one another and the arrangement of the two conductor loops 66 and 68 only in the region of the second antenna sub-conductor 46, the antenna is especially suited for spinal column investigations.

Although modifications and changes may be suggested by those skilled in the art, it is the intention of the inventors to embody within the patent warranted hereon all changes and modifications as reasonably and properly come within the scope of their contribution to the art.

We claim as our invention:

1. An antenna for transmitting signals into or receiving signals from an examination region in a nuclear magnetic resonance apparatus, said antenna comprising:

first and second antenna terminals;

an antenna conductor divided into a plurality of conductor sections and having a first end connected to said first antenna terminal and a second end;

a plurality of capacitive elements respectively disposed between said conductor sections and electrically connecting said conductor sections in series alternating with said capacitive elements, said capacitive elements and, said conductor sections, in combination, defining a resonant frequency of the antenna; and releasable electrical connection means for releasably electrically connecting a selected one of said antenna conductor sections and said second antenna terminal for forming a loop of said antenna conductor of selected size defining said examination region without alteration of said resonant frequency.

2. An antenna as claimed in claim 1 wherein said antenna conductor comprises a frame antenna surrounding said examination region.

3. An antenna as claimed in claim 1 wherein said conductor sections are equal in length, and wherein said capacitive elements have substantially identical capacitance values.

4. An antenna as claimed in claim 1 further comprising a dielectric carrier on which said conductor sections are disposed in series as a plurality of respective electrical interconnects insulated from one another on said dielectric carrier.

5. An antenna as claimed in claim 4 wherein each of said interconnects comprises a slot aligned in a direction of the series connections.

6. An antenna as claimed in claim 1 further comprising a dielectric carrier on which said conductor sections are disposed, said conductor sections comprising a first set of electrically conductive interconnects insulated from one another on a first side of said dielectric carrier and a second set of electrical interconnects insulated from each other disposed on a second, opposite side of said dielectric carrier, said second interconnects respectively overlapping two neighboring first interconnects.

7. An antenna as claimed in claim 6 wherein each of said interconnects comprises a slot aligned in a direction of the series connections.

8. An antenna as claimed in claim 1 wherein said releasable electrical connection means comprises a wiper contact.

9. An antenna as claimed in claim 8 wherein said wiper contact comprises a wiper pick-up connected to said second antenna terminal, and wherein said conductor sections each have a conductive surface and said conductive surfaces of said conductor sections comprising, in combination, a sliding track for said wiper pick-up.

10. An antenna as claimed in claim 9 wherein said conductor sections have a spacing therebetween, and wherein said wiper pick-up has a length in a direction of said series connections which is longer than said spacing.

11. An antenna as claimed in claim 1 further comprising further releasable electrical connection means for forming a further releasable electrical connection between a further selected one of said antenna conductor sections and said first antenna terminal.

12. An antenna as claimed in claim 1 wherein said conductor sections form an antenna conductor which is flexible.

13. An antenna as claimed in claim 12 wherein said releasable electrical connection means comprises a wiper contact, and wherein said antenna conductor comprises catch means mechanically engaging said wiper contact for defining a plurality of respective positions of said free end of said antenna conductor relative to said wiper contact.

14. An antenna as claimed in claim 13 wherein said catch means comprise a plurality of protuberances on said antenna conductor.

15. An antenna as claimed in claim 13 further comprising a housing in the form of a sheath surrounding said antenna conductor, and wherein said catch means comprise a catch projection carried at said sheath at said first end of said antenna conductor and a plurality of catch receptacles in said sheath disposed at said second end of said antenna conductor for individually engaging said catch projection.

16. An antenna as claimed in claim 1 wherein said releasable electrical connection means comprises a wiper contact having a wiper pick-up, and further comprising a housing in the form of a sheath surrounding said antenna conductor, said conductor sections respectively having conductive surfaces and said conductive surfaces, in combination, forming a sliding track for said wiper pick-up, said wiper pick-up being disposed at said second end of said antenna conductor and said free end being insertable into a receptacle of said sheath, said sliding track being disposed at an inside of said receptacle for engagement with said wiper pick-up.

17. An antenna as claimed in claim 1 wherein said antenna conductor comprises a first antenna sub-conductor having first and second ends and a second antenna sub-conductor having first and second ends, said first antenna sub-conductor being separable from said second antenna sub-conductor, and said antenna further comprising further releasable electrical connection means for forming a releasable electrical connection between a further selected one of said antenna conductor sections and said first antenna terminal, said releasable electrical connection means and said further releasable electrical connection means each comprising a wiper contact, said wiper contact comprising said releasable electrical connection means electrically connecting said first end of said first antenna sub-conductor and said first end of said second antenna sub-conductor, and said wiper contact comprising said further releasable electrical connection means electrically connecting said second end of said first antenna sub-conductor and said second end of said second antenna sub-conductor.

18. An antenna as claimed in claim 1 wherein said releasable electrical connection means comprises a wiper contact, said wiper contact having a plurality of wiper pick-ups disposed side-by-side and electrically connected in parallel.

19. An antenna as claimed in claim 1 wherein said releasable electrical connection means comprises a wiper contact having a wiper pick-up with a pick-up surface, wherein said conductor sections each have a conductive surface and said conductive surfaces, in combination, forming a sliding track for said wiper pick-up, and wherein said pick-up surface and said conductive surfaces each comprise a precious metal coating.

20. An antenna as claimed in claim 1 further comprising conductor means for forming a circularly polarizing antenna in combination with said antenna conductor, said conductor means comprising two conductor loops disposed adjacent said examination space at said loop formed by said antenna conductor, said two conductor loops of said conductor means being disposed opposite one another and being electrically connected to each other for respective current flow in each of said two loops in the same direction.

21. An antenna as claimed in claim 20 wherein said two conductor loops of said conductor means are respectively disposed in two substantially planar surfaces, said planar surfaces being oriented obliquely relative to each other.

22. An antenna as claimed in claim 20 wherein said antenna conductor comprises a first antenna sub-conductor and a second antenna sub-conductor, and wherein said two conductor loops of said conductor means are disposed at one of said first or second antenna sub-conductors.

* * * * *